US011690184B2

(12) United States Patent
Brunnbauer et al.

(10) Patent No.: US 11,690,184 B2
(45) Date of Patent: *Jun. 27, 2023

(54) PORTABLE INTERFACE SYSTEM

(71) Applicant: WORKAROUND GMBH, Munich (DE)

(72) Inventors: Konstantin Brunnbauer, Munich (DE); Michael Kettner, Munich (DE)

(73) Assignee: WORKAROUND GMBH, Munich (DE)

( * ) Notice: Subject to any disclaimer, the term of this patent is extended or adjusted under 35 U.S.C. 154(b) by 602 days.

This patent is subject to a terminal disclaimer.

(21) Appl. No.: 16/792,994

(22) Filed: Feb. 18, 2020

(65) Prior Publication Data

US 2020/0267852 A1 Aug. 20, 2020

(30) Foreign Application Priority Data

Feb. 18, 2019 (DE) .................. 10 2019 104 033.7

(51) Int. Cl.
| | |
|---|---|
| H05K 5/00 | (2006.01) |
| B65H 75/48 | (2006.01) |
| F16B 1/00 | (2006.01) |
| G06K 7/10 | (2006.01) |
| G06K 7/14 | (2006.01) |
| H01F 7/02 | (2006.01) |
| H05K 5/02 | (2006.01) |
| F16B 2/02 | (2006.01) |
| F16B 2/20 | (2006.01) |

(52) U.S. Cl.
CPC ......... *H05K 5/0086* (2013.01); *B65H 75/486* (2013.01); *F16B 1/00* (2013.01); *G06K 7/10366* (2013.01); *G06K 7/1413* (2013.01); *H01F 7/0252* (2013.01); *H05K 5/0204* (2013.01); *B65H 2701/34* (2013.01); *F16B 2/02* (2013.01); *F16B 2/20* (2013.01); *F16B 2001/0028* (2013.01); *F16B 2001/0035* (2013.01)

(58) Field of Classification Search
CPC .. G06F 1/1632; H05K 5/0086; H05K 5/0286; H05K 5/0204; H05K 7/1454
USPC ........................................................ 361/809
See application file for complete search history.

(56) References Cited

U.S. PATENT DOCUMENTS

| | | | | |
|---|---|---|---|---|
| 9,800,283 | B2 * | 10/2017 | Schmidt ................. | H04M 1/04 |
| 9,907,416 | B1 * | 3/2018 | Taylor .................... | F16M 11/10 |
| 11,314,282 | B2 * | 4/2022 | Brunnbauer ........... | G06K 7/109 |
| 2011/0096512 | A1 * | 4/2011 | Klicpera ............. | G06K 7/10881 |
| | | | | 361/747 |
| 2011/0290889 | A1 * | 12/2011 | Tamburrini ............ | G06K 7/109 |
| | | | | 235/472.01 |
| 2016/0350058 | A1 * | 12/2016 | Zhu ..................... | H04N 21/4126 |

(Continued)

FOREIGN PATENT DOCUMENTS

KR 10 2001 0 075 730 A 8/2001

*Primary Examiner* — Todd M Epps
(74) *Attorney, Agent, or Firm* — Dilworth IP, LLC

(57) ABSTRACT

A portable interface system including an interface device, in particular a sensor device, and a base part, wherein the base part includes an attachment area for the interface device and a retraction device, wherein the retraction device is attached to the interface device and is designed to move the interface device into a predefined holding position in the attachment area, wherein the interface device is detachably fixed without tools in the holding position in the attachment area.

19 Claims, 6 Drawing Sheets

(56) References Cited

U.S. PATENT DOCUMENTS

2017/0179726 A1* 6/2017 Garrity .................. H02J 50/10
2018/0054695 A1* 2/2018 Castor ................. H04W 68/005

* cited by examiner

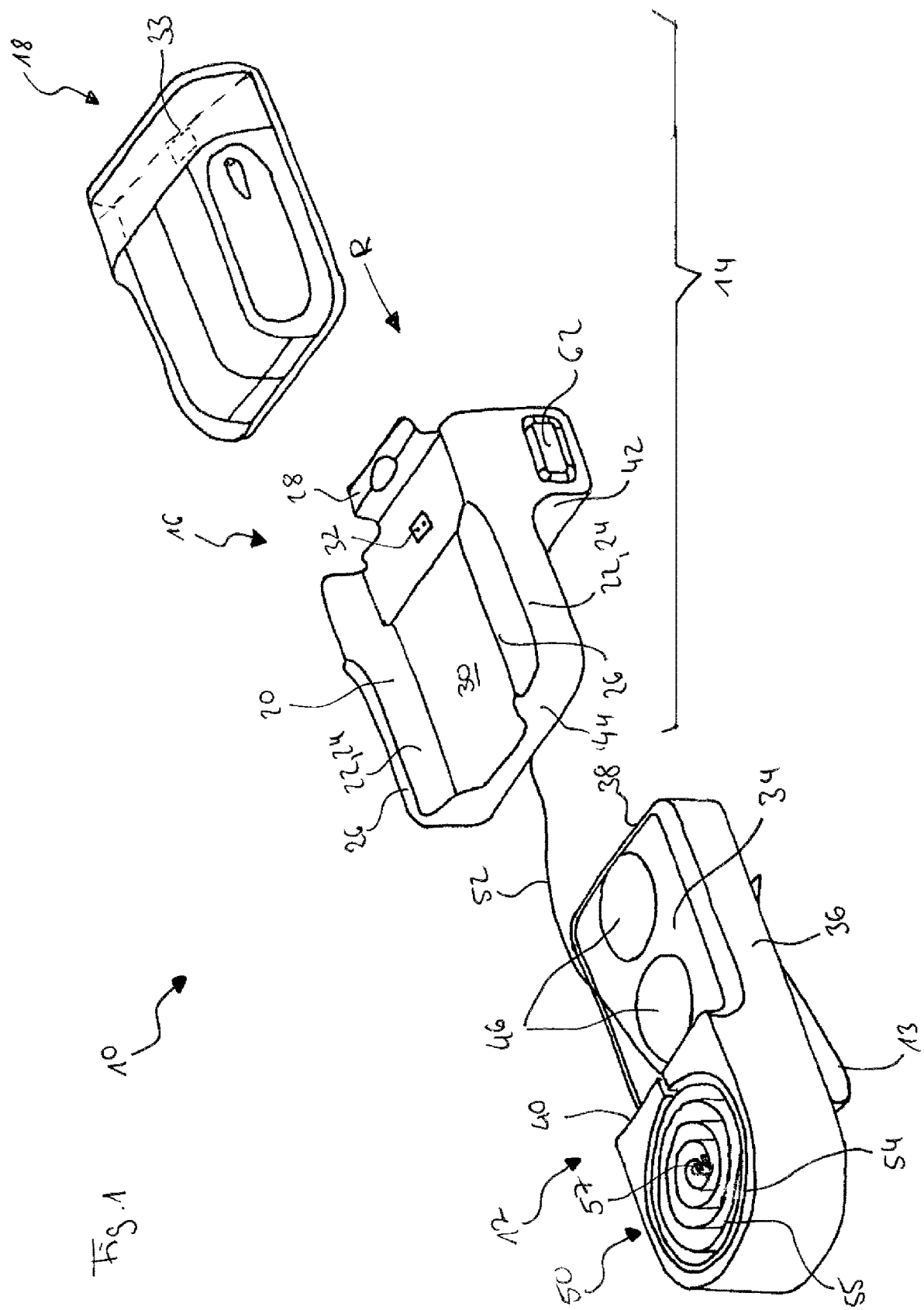

PORTABLE INTERFACE SYSTEM

FIELD OF THE DISCLOSURE

The disclosure relates to portable interface system.

BACKGROUND

Portable interface systems are used to read, display, forward and/or store data. In production processes, interface systems are used, for example, for reading information about used components or for transferring information to a database for storage. In this way, it is possible to establish which components have been built in a specific product. However, interface systems are also used in logistics centers, in particular to read information about a product and to control processes by means of a barcode.

In many processes, the user needs to always carry an interface system with him or have one within easy reach. To a make a process particularly efficient, it is desirable that the user always knows exactly where the interface system is located so that the user can more or less blindly reach for the interface system if it is required. This can be achieved, for example, by having the user always place the interface system in exactly the same place after use. However, this requires both discipline and time.

SUMMARY

Thus, there is a need to provide an interface system which enables a process to be implemented particularly efficiently in terms of time.

The object is solved according to the disclosure by means of a portable interface system comprising an interface device, in particular a sensor device, a retraction device and a base part, wherein the base part comprises an attachment area for the interface device, wherein the retraction device is designed to move the interface device into a predefined holding position in the attachment area, wherein the interface device is tool-free detachably fixed in the holding position in the attachment area.

This means that the interface device can be easily detached from the base part if it is required, for example in order to display, read in and/or read out data.

After use, the interface device is moved back into a predefined holding position by means of the retraction device. Thus, a user does not have to move the interface device back into its holding position himself and can apply himself to the next operation immediately after using the interface device. In particular, it suffices if the user releases his hold on the interface device in order to enable the interface device to move back into the holding position by means of the retraction device. This means the retraction device is then active if the interface device is detached from the base part and is not being held.

The interface device is fixed preferably in position with a defined holding force in the attachment area by means of a holding means, wherein the holding force is so large that the interface device is reliably held in the defined holding position and cannot detach itself from the base part unintentionally.

The interface device is attached in particular in a defined alignment in the holding position so that the user knows exactly how the interface device is aligned even if he reaches for it blindly. In particular, the holding position for the corresponding activity is selected ergonomically so that it is not necessary to change the grip being used on the interface device after it is detached from the base part in order to operate it.

As the interface system is portable, it can be carried by the user over larger distances if necessary, for example in a production line. "Portable" means within the scope of this disclosure that interface system can be carried by the user on his body or on a moveable object, such as a cart, for example a shopping cart.

For example, the base part comprises the retraction device, wherein the retraction device is attached to the interface device, thereby enabling the weight of the interface device to be kept low.

Alternatively, the interface device can comprise the retraction device, wherein the retraction device is attached to the base part. As a result, the base part can be produced very easily.

A combination of these two alternatives is also conceivable in order to distribute the weight of the retraction device between both components.

The interface device comprises, for example, an electronic module and a holder, wherein the holder has a retainer that is designed to receive the electronic module. In this regard, the retainer is particularly suitable for attaching the electronic module repeatably without using tools. Electronic modules are normally expensive to purchase. By designing the electronic module separately, the electronic module can be reused if parts of the interface system need to be replaced due to wear. Furthermore, the electronic module can be used in various identical or similar interface systems equally. This means that if an interface system is not in use at times, the electronic module can be used in another interface system. In this way, investment costs can be kept low.

According to an embodiment, the holder comprises at least one switch and one mating contact which is connected to the switch electrically and the electronic module comprises at least one contact element, wherein said at least one mating contact and said at least one contact element are electrically contacted if electronic module is inserted into the retainer of the holder. The electronic module is therefore ready to function as soon as it is inserted into the retainer without having to establish a contact manually. If the electronic module is intended to be used in various interface devices, this is advantageous as interchanging the electronic module is particularly easy.

In particular, the electronic module itself does not have a switch that is operable externally.

The base part can comprise at least one magnetic component, in particular a permanent magnet and/or a ferromagnetic element, in the attachment area and the interface device can also comprise at least one magnetic component, in particular a permanent magnet and/or a ferromagnetic element, wherein the magnetic components are aligned in such a way that the interface device is detachably attached to the base part. This means as said at least one magnetic component magnetically attracts said at least one ferromagnetic component and/or said at least one further magnetic component, the interface device can be drawn towards the attachment area of the base part and held against it. The magnetic component thus acts as a holding means.

Moreover, said at least one magnetic component can used to align the interface device in the holding position.

In particular, the force of attraction is thus designed in such a way that a user can detach the interface device without any excessive force.

For example, the base part in the attachment area and the interface device each comprise two magnetic components aligned in opposition that are located next to each other in top view on a contact surface of the interface device or on a contact surface of the base part, wherein the magnetic components of the base part and the magnetic components of the interface device are located and aligned to be complementary in such a way that they align the interface device in the holding position. This is achieved by attracting the opposing poles to each other so that the interface device is automatically brought into a predefined holding position advantageously. As the magnetic components have a certain range, the magnet components can already begin to align the interface device as soon as the interface device has been moved close to the base part by the retraction device. Thus, the interface device can already be in the defined holding position preferably upon contact with the base part. Alternatively, it is also conceivable that the interface device is first moved into the defined holding position after contact with the base part.

The retraction device can comprise a spring-loaded rotatable reel and a cord wound on the reel, said cord being attached to the interface device on its free end, wherein the retraction device is designed in such a way that the reel is rotated by the spring force in the winding direction when the cord is pulled out and not held by an external force. If the user removes the interface device from the base part, the reel, more specifically a spring, is wound up which applies a force to the reel. In doing so, the potential energy present in the retraction device is increased which can be used to move the interface device back into the holding position from a pulled-out position.

The reel is prestressed, for example, by means of a spiral spring.

Within the scope of the disclosure, a cord is also understood to mean a small strip, a wire, a chain or something similar.

According to an embodiment, a guide is provided for the interface device on the base part, in particular in the attachment area, wherein the interface device is aligned in the holding position by the guide, in particular if the interface device is held against the base part. The interface device can be moved along the guide to detach the interface device from the base part. In doing so, said at least one magnet component of the interface device is slid in relation to said at least one magnetic component of the base part so that the forces of attraction are reduced and the interface device can be detached more easily from the base part.

If the base part and the interface device each comprise two magnetic components aligned in opposition, magnet components with the same poles directed towards each other can come to rest one over the other when sliding the interface device along the guide so that repulsive forces form between the base part and the interface device. A user has to apply less force to slide the interface device from the holding position than that which is required to detach the interface device directly without sliding it from the base part. As a result of the guide, the interface device can therefore be operated particularly ergonomically.

A stop can be provided on the interface device, wherein the stop rests against an end face of the base part if the interface device is fixed in position on the base part. Thus, the interface device is supported in the holding position mechanically. In particular, the stop limits the attachment area.

In an embodiment of the disclosure, the base part comprises at least a fastening means for fastening the base part onto an item of clothing, onto the body of a user or onto a moveable object, such as a cart, in particular a shopping cart. Thus, the holding position is predefined in particular in relation to the fastening means. In this way, a specific position and alignment of the interface device relative to the user or to the object can always be guaranteed.

The fastening means can comprise a clasp, a clip, a clamp, an elastic band, a fastening piece that fastens magnetically and/or a hook-and-loop fastener. By means of such a fastening means, a user can always carry the interface device with him within easy reach without having to hold the interface device.

According to the embodiment, the interface device comprises at least a sensor, in particular a barcode scanner, a RFID reader, a touch-sensitive surface and/or at least an output means, in particular a screen, in particular wherein the electronic module comprises said at least one sensor and/or said at least one output means. In this way, the interface system can be used versatilely.

In particular, the holder comprises neither such a sensor—except for the switches and the circuit—nor an output means.

The interface system is preferably designed in such a way that the interface device is activated if the interface device is detached from the base part. This means the interface device is put in an operating state as a result of the detachment, in which said interface device can scan for example. The operation of the interface systems is particularly easy as a result.

DESCRIPTION OF THE DRAWINGS

Additional advantages and features of the disclosure can be found in the following description and in the attached drawings to which reference is made. In the drawings:

FIG. 1 shows an exploded view of an interface system according to the disclosure.

DETAILED DESCRIPTION

FIG. 1 shows an interface system 10 in an exploded view. The interface system 10 comprises a base part 12 as well as an interface device 14 that can be tool-free detachably fixed onto the base part 12.

The interface device 14 is used for reading or scanning in data in the shown embodiment. After collecting this data, it can be transmitted to a server wirelessly by the interface device 14 and be stored in a database and/or be displayed directly on an output means of the interface device 14, for example on a screen.

For this purpose, the interface device 14 comprises a sensor, such as a barcode scanner, a RFID reader and/or a touch-sensitive surface.

The sensor faces forward, in particular in the case of a barcode scanner, i.e. away from the base part 12. To this end, a corresponding window is provided in the front end face of the interface device 14.

The interface system 10 is portable and can be carried by the user easily. A fastening means 13 is provided in the form of a clip on the base part 12, by means of which the base part 12 can be fastened onto an item of user's clothing, so that the user can carry the interface system 10 with him without having to constantly hold it in his hand. The fastening means 13 can also comprise a clasp, a clamp, an elastic band, a fastening piece that fastens magnetically and/or a hook-and-loop fastener instead of a clip.

Figure 5:
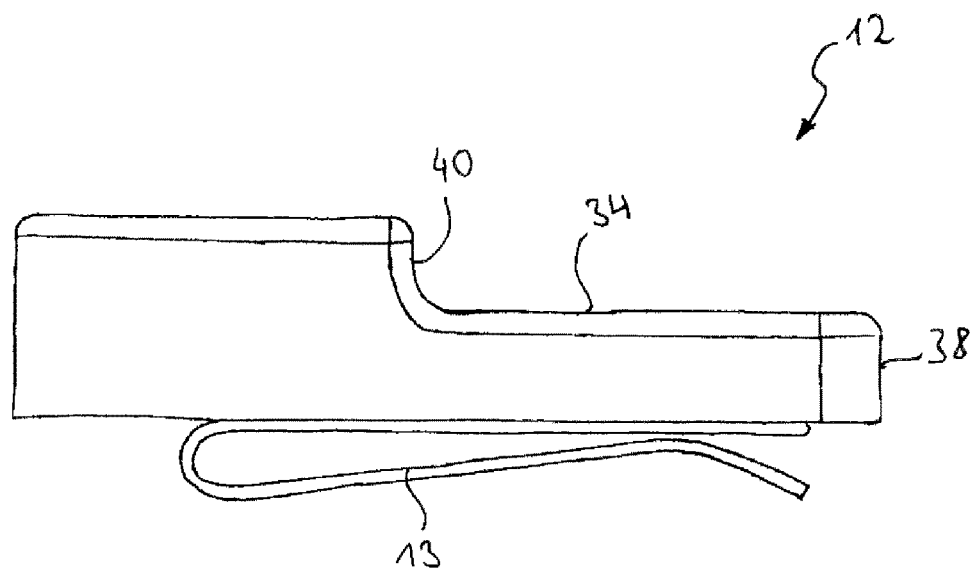
FIG. 5 shows the base part from FIG. 2 in a side view.
Figure 4:
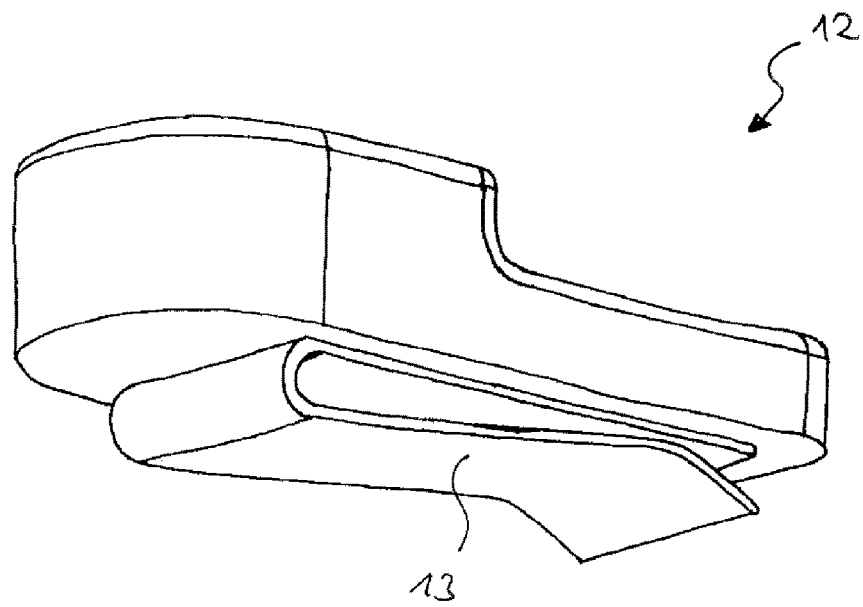
FIG. 4 shows the base part from FIG. 2 in a perspective view.

FIGS. 4 and 5 show the base part 12 in two additional views, in which the fastening means 13 can be discerned easily.

It is also conceivable that the fastening means 13 is designed for fastening the interface system 19 onto a moveable object, for example a shopping cart.

In the shown embodiment, the interface device 14 is in two parts and comprises a holder 16 as well as an electronic module 18 that can be received in the holder 16. The sensor of the interface device 14 is integrated in particular into the electronic module 18. It is however conceivable that interface device 14 is designed as one piece.

Figure 6:
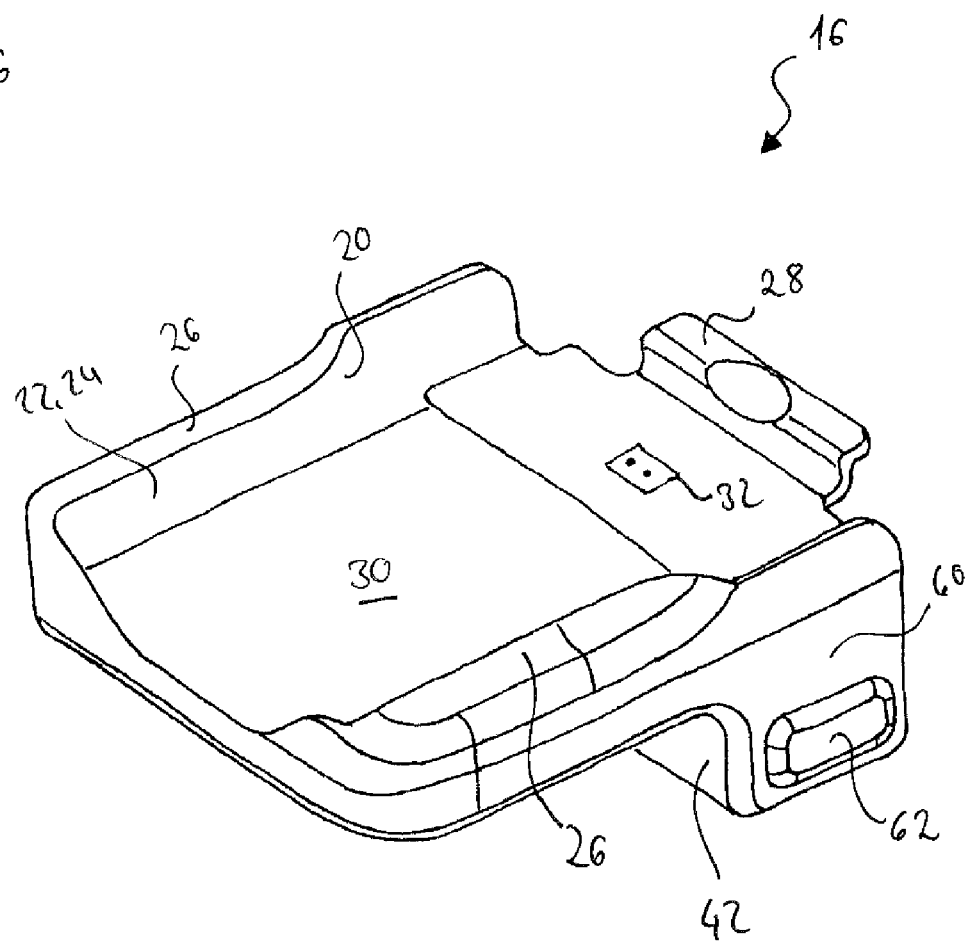
FIG. 6 shows the holder from FIG. 3 in a perspective view.

The holder 16 comprises a retainer 20 to receive the electronic module 18, said retainer 20 enabling the repeated detachment of the electronic module 18 from the holder 16 and reinsertion of the electronic module 18 into the holder 16. A detailed view of the holder 16 can be seen in FIG. 6.

In the shown embodiment, the retainer 20 comprises two lateral guides 22, in which the electronic module 18 can be inserted in an insertion direction R, wherein the guides 22 run in the insertion direction R of the electronic module 18.

The guides 22 each consist of a lateral guide wall 24 and a bracket 26 that run from the guide wall 24 towards the opposite guide wall 24. Moreover, the retainer 20 comprises a locking device 28 that holds the electronic module 18 in the retainer 20.

Two mating contacts 32 are provided on a contact surface 30 of the holder 16, against which the electronic module 18 rests in an attached state. The electronic module 18 has two corresponding contact elements 33 on its underside. If the electronic module 18 is located in the holder 16, the contact elements 33 and the mating contacts 32 are electrically contacted in pairs.

The electronic module 18 is activated or triggered if both contact elements 33 are connected electrically.

The base part 12 has an attachment area 34, against which the interface device 14 can rest in a predefined holding position. The predefined holding position is predefined particularly in relation to the fastening means 13.

The attachment area 34 is limited by two side walls 36, an end face 38 and a step 40 of the base part 12.

The interface device 14, in particular the holder 16, has a stop 42 that rests against the front end face 38 of the base part 12 if the interface device 14 is in the defined holding position. In addition, an end face 44 of the holder 16 can rest against the step 40 of the base part 12.

Two magnetic components 46 are located in the attachment area 34 of the base part 12, said magnet components 46 comprise for example permanent magnets or a ferromagnetic material. The magnetic components 46 are used to hold the interface device 14 in the defined holding position in the attachment area 34. However, in principle, a magnet component 46 suffices for attaching the interface device 14 to the base part 12.

Figure 3:
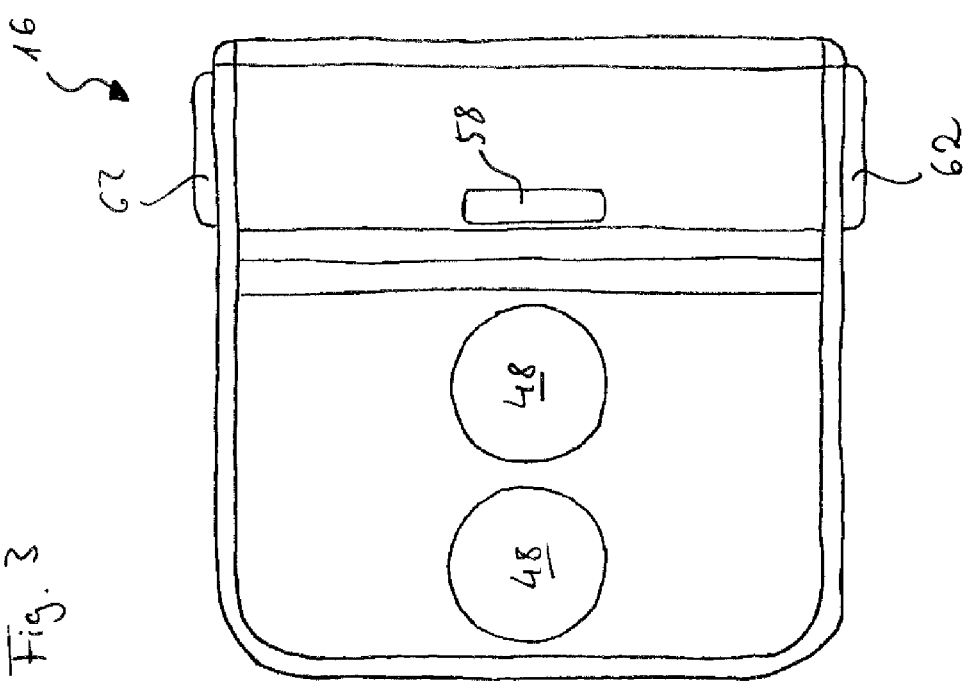
FIG. 3 shows a holder of the interface systems according to FIG. 1 in bottom view.

The holder 16 of the interface device 14 also comprises two magnetic components 48 that are visible in FIG. 3 and are used to attach the interface device 14 to the base part 12 owing to the fact that the magnetic components 48 are attracted by the magnet components 46 of the base part 12. If the base part 12 only comprises one magnetic component 46, one magnetic component 48 also suffices for the holder 16.

Figure 2:
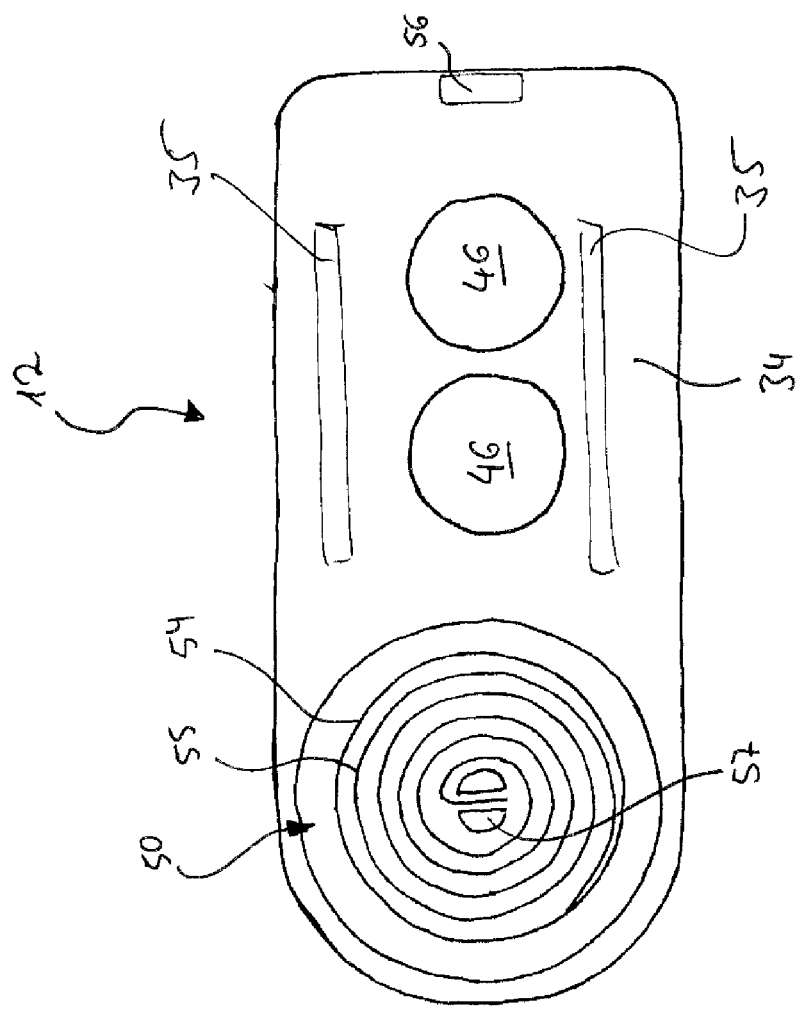
FIG. 2 shows a base part of the interface systems according to FIG. 1 in top view.

FIG. 2 shows the base part 12 in top view. As can already been seen in FIG. 1, the two magnetic components 46 are located next to each other. Both magnetic components 48 are also located next to each other, as can be seen in FIG. 3, wherein the magnetic components 46 of the base part 12 and the magnetic components 48 of the holder 16 are located congruently when the interface device 14 is in the holding position.

The magnetic components 46 of the base part 12 and the magnetic components 48 of the interface device 14 are aligned complementarily, which means the magnetic components 46 lying one on top of the other in the holding position mutually attract each other.

In addition, the two magnetic components 46 of the base part 12 and the magnetic components 46 of the interface device 14 are aligned in opposition. As a result, a defined holding position of the interface device 14 is already determined by the configuration of the magnetic components 46, 48 as only one magnetic component 46 of the base part 12 and one magnetic component 48 of the interface device 14 attract in pairs in each case. The respective other magnetic component 46, 48 of the base part 12 or the interface device 14 is repelled.

The opposing alignment of the magnetic components 46, 48 can also be used to detach the interface device 14 from the base part 12 more easily. To this end, a user can slide the interface device 14 on the base part 12 to a certain extent and in such a way that the repelling magnet components 46, 48 overlap to a certain extent. As a result, the interface device 14 detaches from the base part 12, thereby making the handling of the interface system 10 particularly ergonomic.

In addition, the base part 12 comprises a retraction device 50 that is attached to the interface device 14 in order to simplify the handling of the interface system 10. The retraction device 50 can move the interface device 14 into the predefined holding position if the interface device 14 has been detached previously from the base part 12.

In the shown embodiment, the retraction device 50 comprises a cord 52 that is attached on one free rear end to the interface device 14, in particular to the holder 16, and on the other free end to the rotatable reel 54.

The rotatable reel 54 is acted upon by a spring force caused by the spring 55, for example by a spiral spring that is located in the interior of the reel 54.

In this regard, the spring 55 is attached on one free end to an inner wall of the reel 54 and on the other free end to a pin 57.

If the interface device 14 is removed from the base part 12, then the reel 54 rotates in an unwinding direction and the cord 52 is pulled out, as is shown in FIG. 1.

The spring 55 is tensioned further when the cord 52 is pulled out so that the potential energy stored in the spring 55 increases. If the interface device 14 is detached from the base part 12 and not held by a user, the potential energy stored in the spring 55 is used to move the interface device 14 back into its defined position on the base part 12.

To enable the sliding to be defined, there can be a guide 35 for the interface device 14 in the attachment area 34, as is indicated in FIG. 2.

Of course, it is also conceivable that the retraction device 50 is provided on the interface device 14, in particular the reel 54 and the spring 55, and that the cord 52 is attached to the base part 12. A combination of these possibilities is also conceivable.

To make the operability of the interface system 10 more simple, it is also provided that the electronic module 18 is automatically put into the operation state if the interface device 14 is detached from the base part 12.

This is ensured by the circuit S of the holder 16 in the shown embodiment.

Figure 7:
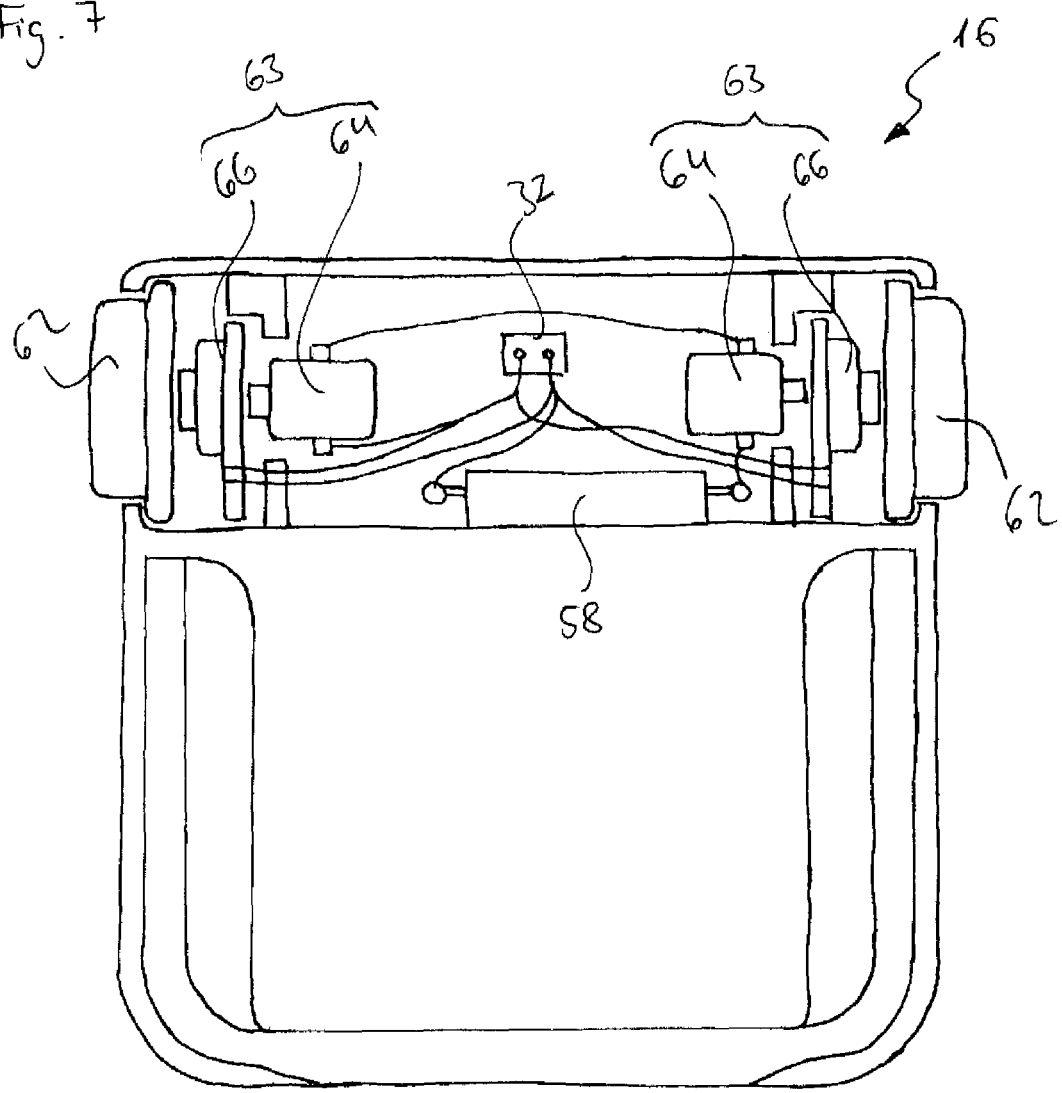
FIG. 7 shows an open view of the holder from FIG. 3.

In FIG. 7, the holder 16 is shown opened so that the circuit S provided in the holder 16 is visible. A corresponding equivalent circuit diagram of the circuit S is shown in FIG. 8.

Figure 8:
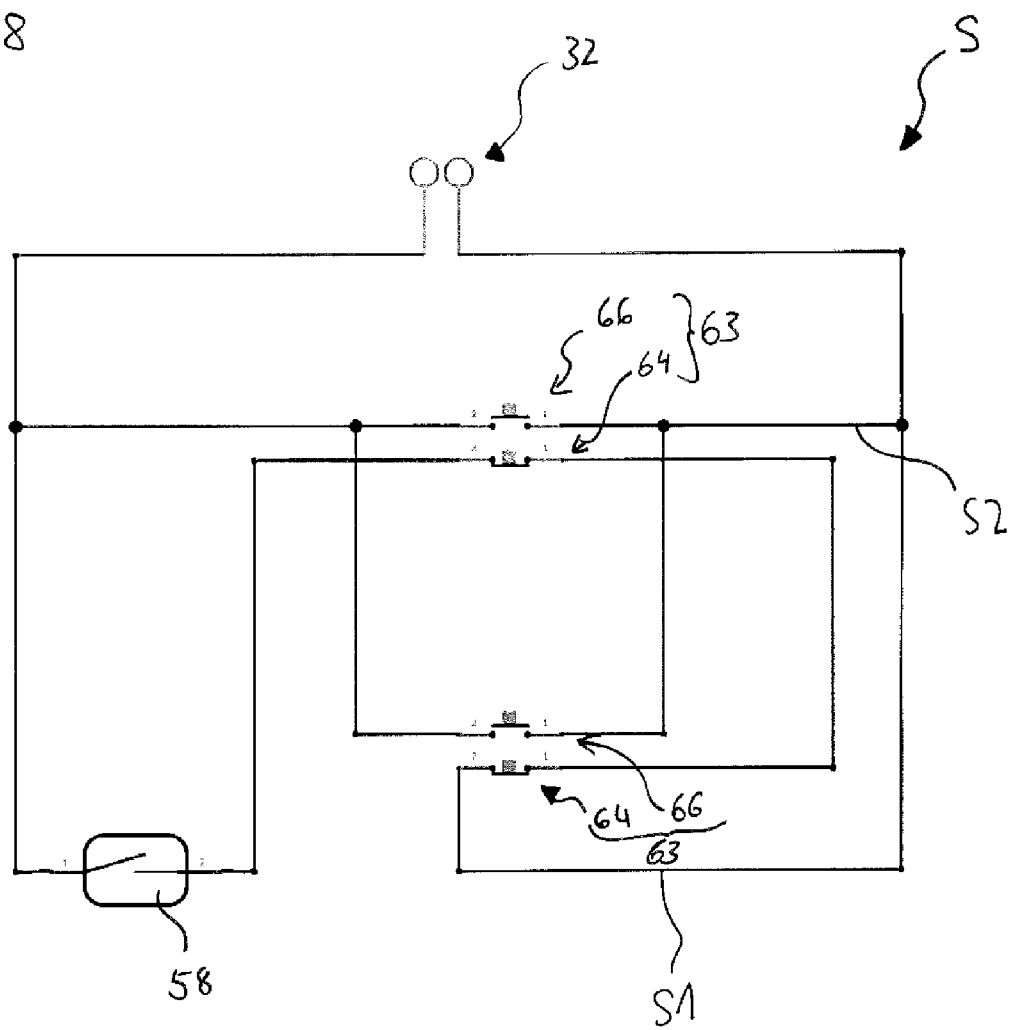
FIG. 8 shows a circuit of the holder illustrated in FIG. 7.

FIG. 8 shows a state in which the interface device 14 is located on the base part 12 and the switch 58 is actuated, in particular is open, so that the interface 14, in particular the electronic module 18, is inactive.

The circuit S comprises a first branch S1 and a second branch S2 as well as a first switch 58 and here two second switches 63.

An electrical connection can be established between both mating contacts 32 both via the first branch S1 and via the second branch S2, thus activating the electronic module 18. Thus, the branches S1, S2 run in parallel.

The first switch 58 is provided in the first branch S1 and can open or (partially) close this branch S1. In the shown embodiment, the first switch 58 is a solenoid switch.

Both second switches 63 each have a first circuit element 64 and a second circuit element 66, wherein in each case the first circuit element 64 is located in the first branch S1 of the circuit S and the second circuit element 66 in the second branch S2 of the circuit S. The switch elements 64, 66 can open or (partially) close their respective branch S1, S2.

The first switch elements 64 are connected in series in the first branch S1, in particular in series with the first switch 58.

The second switch elements 66 are connected in parallel in the second branch S2.

In the shown embodiment, the first switch element 64 is a NC switch element in each case, which means a switch element that is closed without being acted upon by an external force.

In the shown embodiment, the second switch element 66 is a NO switch element in each case, which means a switch element that is open without being acted upon by an external force.

As shown in FIG. 7, both switch elements 64, 66 can be configured as separate switch elements that combined together form the switch 63. It is however conceivable that the switch 63 is designed as a component with two switching points that constitute the switching elements 64, 66.

The switch 63 and thus the switching elements 64, 66 can be actuated mechanically by means of an actuating element 62, as is evident in FIG. 7.

To automatically activate the interface device 14, in particular the electronic module 18, when it removed from the base part 12, a magnet 56 (FIG. 2) is located on the base part 12 in such a way that it actuates the first switch 58 when the interface device 14 is in the holding position. Alternatively, it is also conceivable that the first switch 58 can be shifted mechanically by a corresponding element on the base part 12.

If the interface device 14 is on the base part 12 in the defined holding position, the switch 58 is kept open by means of the magnet 56. If the interface device 14 is detached from the base part 12, the first switch 58 closes as a result of the cessation of the magnetic repulsive forces of the magnet 56.

The first branch S1 of the circuit S is thus closed, thereby activating the electronic module 18—provided that the actuating elements 62 are not actuated. A user can thus implement a relevant operation, for example a data capture process with the scanner, immediately after detaching the interface device 14 from the base part 12.

When the operation is completed, the interface device 14 can be moved back into its holding position on the base part 12 by the retraction device 50, thereby opening the switch 58 once again and bringing about the deactivated state of the electronic module 18.

It is however also conceivable that a user would like to implement several operations successively. In this case, it would be impractical if the interface device 14 would have to be repeatedly moved into the holding position and detached once again in order to start a new operation.

Therefore, the actuating elements 62 are each located on the lateral external walls 60 of the holder 16 on both sides. The actuating elements 62 are for example push buttons.

If the actuating elements 62 are pushed by a user, the first switch element 64 is initially actuated and shortly after the second switch element 66 of the respective switch 63.

By viewing FIG. 8, it becomes clear that the first branch S1 of the circuit S is broken by actuating one of the switches 63 initially by the corresponding first switch element 64.

As a result, the mating contacts 32 are disconnected electrically, thereby briefly deactivating the interface device 14, in particular the electronic module 18.

This state is however only short-lived as the second switch element 66 is actuated after actuating the first switch element 64 so that the second branch S2 of the circuit S is closed, thereby in turn connecting the mating contacts 32 and thus the contact elements 33 electrically. The electronic module 18 is thus activated.

Therefore, it suffices if the user actuates only one of the two actuating elements 62 in order to start a new data capture process. Taking ergonomics into consideration, it is however more comfortable for a user to push both actuating elements 62 simultaneously. Moreover, in this way, the interface system 10 is easy to use for left-handed and right-handed people equally.

In an alternative embodiment, only a second switch 63 is provided for example.

The invention claimed is:

1. A portable interface system comprising an interface device, in particular a sensor device, a retraction device and a base part, wherein the base part comprises an attachment area for the interface device, wherein the retraction device is designed to move the interface device into a predefined holding position in the attachment area, wherein the interface device is fixed detachably without tools in the holding position in the attachment area.

2. The portable interface system according to claim 1, wherein the base part comprises the retraction device, wherein the retraction device is attached to the interface device.

3. The portable interface system according to claim 1, wherein the interface device comprises the retraction device, wherein the retraction device is attached to the base part.

4. The portable interface system according to claim 1, wherein the interface device comprises an electronic module and a holder, wherein the holder has a retainer that is designed to receive the electronic module.

5. The portable interface system according to claim 4, wherein the holder comprises at least one switch and one mating contact which is connected to the switch electrically and that the electronic module comprises at least one contact element, wherein said at least one mating contact and said at least one contact element are electrically contacted if the electronic module is inserted into the retainer of the holder.

6. The portable interface system according claim 1, wherein the base part comprises at least one magnetic component and the interface device also comprises at least one magnetic component, wherein the magnetic components are aligned in such a way that the interface device is attached detachably to the base part.

7. The portable interface system according claim 6, wherein the at least one magnetic component of at least one of the base part and the interface device is at least one of a permanent magnet and a ferromagnetic element.

8. The portable interface system according to claim 6, wherein the base part in the attachment area and the interface device each comprise two magnetic components aligned in opposition that are located next to each other in top view on a contact surface of the interface device or on a contact surface of the base part, wherein the magnetic components of the base part and the magnetic components of the interface device are located and aligned to be complementary in such a way that they align the interface device in the holding position.

9. The portable interface system according to claim 1, wherein the retraction device comprises a spring-loaded rotatable reel and a cord wound on the reel, said cord being attached to the interface device with its free end, wherein the retraction device is designed in such a way that the reel is rotated by a spring force in a winding direction when the cord is pulled out and not held by an external force.

10. The portable interface system according to claim 1, wherein a guide is provided for the interface device on the base part, wherein the interface device is aligned in the holding position by the guide.

11. The portable interface system according to claim 10, wherein the guide is provided in the attachment area.

12. The portable interface system according to claim 1, wherein a stop is provided on the interface device, wherein the stop rests against an end face of the base part if the interface device is fixed in position on the base part.

13. The portable interface system according to claim 1, wherein the base part comprises at least a fastening means for fastening the base part onto an item of clothing, onto a body of a user or onto a moveable object.

14. The portable interface system according to claim 13, wherein the fastening means comprises at least one of a clasp, a clip, a clamp, an elastic band, a fastening piece that fastens magnetically and a hook-and-loop fastener.

15. The portable interface system according to claim 1, wherein the interface device comprises at least one of at least one sensor and at least one output means.

16. The portable interface system according to claim 15, wherein the at least one sensor is at least one of a barcode scanner, a RFID reader, and a touch-sensitive surface.

17. The portable interface system according to claim 15, wherein the at least one output means is a screen.

18. The portable interface system according to claim 15, wherein the interface device comprises an electronic module, wherein the electronic module comprises at least one of said at least one sensor and said at least one output means.

19. The portable interface system according to claim 1, wherein the interface system is designed in such a way that the interface device is activated by detaching the interface device from the base part.

\* \* \* \* \*